(12) United States Patent
Ehiasarian et al.

(10) Patent No.: US 11,131,016 B2
(45) Date of Patent: Sep. 28, 2021

(54) COATED SUBSTRATE

(71) Applicant: ROLLS-ROYCE plc, London (GB)

(72) Inventors: Arutiun Ehiasarian, Sheffield (GB); Papken Hovsepian, Sheffield (GB); David S Rickerby, Derby (GB); Mark Dixon, Ashbourne (GB)

(73) Assignee: ROLLS-ROYCE plc, London (GB)

( * ) Notice: Subject to any disclaimer, the term of this patent is extended or adjusted under 35 U.S.C. 154(b) by 243 days.

(21) Appl. No.: 16/250,471

(22) Filed: Jan. 17, 2019

(65) Prior Publication Data
US 2019/0249291 A1 Aug. 15, 2019

(30) Foreign Application Priority Data

Feb. 15, 2018 (GB) ..................................... 1802468

(51) Int. Cl.
| | | |
|---|---|---|
| *C23C 16/06* | (2006.01) | |
| *C23C 14/06* | (2006.01) | |
| *C23C 14/35* | (2006.01) | |
| *F01D 5/28* | (2006.01) | |
| *C23C 28/04* | (2006.01) | |
| *H01J 37/34* | (2006.01) | |
| *C23C 14/34* | (2006.01) | |

(Continued)

(52) U.S. Cl.
CPC ........ *C23C 14/0641* (2013.01); *C23C 14/025* (2013.01); *C23C 14/067* (2013.01); *C23C 14/3485* (2013.01); *C23C 14/35* (2013.01); *C23C 28/04* (2013.01); *C23C 28/042* (2013.01); *C23C 28/044* (2013.01); *C23C 28/42* (2013.01); *F01D 5/288* (2013.01); *H01J 37/3467* (2013.01); *F05D 2230/31* (2013.01); *F05D 2230/90* (2013.01); *F05D 2300/18* (2013.01); *F05D 2300/22* (2013.01); *F05D 2300/2282* (2013.01); *F05D 2300/2283* (2013.01); *F05D 2300/506* (2013.01); *F05D 2300/611* (2013.01)

(58) Field of Classification Search
CPC .......................... C23C 14/025; C23C 14/0641
USPC ........................................ 428/697, 698, 699
See application file for complete search history.

(56) References Cited

U.S. PATENT DOCUMENTS

| | | |
|---|---|---|
| 5,283,109 A | 2/1994 | Kaplan et al. |
| 8,025,956 B2 | 9/2011 | Yamamoto et al. |

(Continued)

FOREIGN PATENT DOCUMENTS

| | | |
|---|---|---|
| CN | 105256273 A | 1/2016 |
| EP | 2 149 624 A1 | 2/2010 |

(Continued)

OTHER PUBLICATIONS

Jul. 12, 2019 Extended Search Report issued in European Application No. 19152154.1.

(Continued)

*Primary Examiner* — Archene A Turner
(74) *Attorney, Agent, or Firm* — Oliff PLC

(57) ABSTRACT

A coated substrate comprising a metal or metal alloy such as a high speed steel, TiAl based alloy or Ni based alloy or an electrically conductive ceramic material, wherein the coating comprises a hard material protective coating comprising alternating layers of different compositions, wherein a first composition of the alternating layers comprises silicon, Si, and/or a second composition of the alternating layers comprises boron, B.

18 Claims, 3 Drawing Sheets

Figure 1:
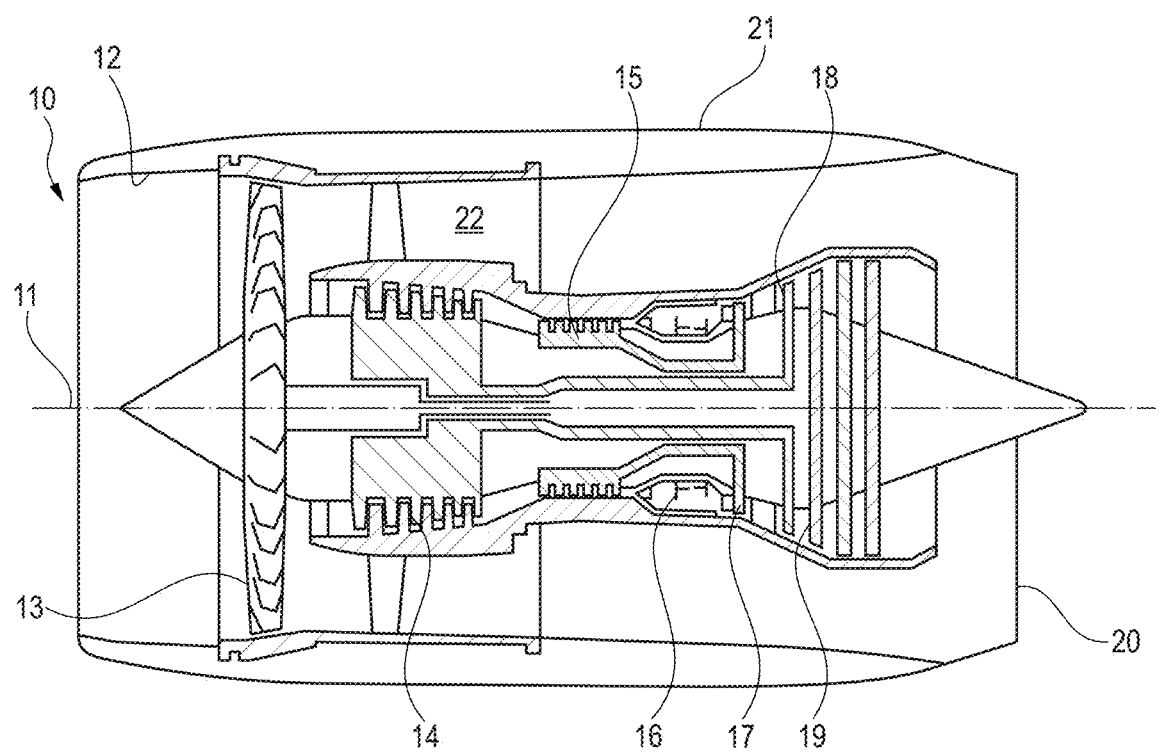

(51) Int. Cl.
*C23C 28/00* (2006.01)
*C23C 14/02* (2006.01)

(56) References Cited

U.S. PATENT DOCUMENTS

| | | | |
|---|---|---|---|
| 2005/0170162 A1* | 8/2005 | Yamamoto | C23C 28/341 428/698 |
| 2007/0184306 A1* | 8/2007 | Yamamoto | C23C 14/06 428/698 |
| 2008/0003418 A1 | 1/2008 | Yamamoto et al. | |
| 2010/0028636 A1* | 2/2010 | Vetter | C23C 14/024 428/446 |
| 2010/0226783 A1* | 9/2010 | Lipkin | C23C 30/00 416/241 B |
| 2010/0304102 A1* | 12/2010 | Vetter | C23C 28/044 428/336 |
| 2014/0363648 A1* | 12/2014 | Yamamoto | C23C 14/325 428/216 |
| 2016/0221156 A1 | 8/2016 | Baik et al. | |
| 2017/0152602 A1* | 6/2017 | Abe | C23C 30/005 |
| 2017/0204871 A1 | 7/2017 | Araki et al. | |

FOREIGN PATENT DOCUMENTS

| | | |
|---|---|---|
| EP | 2 792 765 A1 | 10/2014 |
| GB | 2 450 950 A | 1/2009 |
| JP | 3239505 B2 | 12/2001 |

OTHER PUBLICATIONS

Lembke et al., "Significance of Y and Cr in TiAlN hard coatings for dry high speed cutting;" Surface Engineering 17(2) pp. 153-158 (2001).

Jul. 4, 2018 Search Report issued in British Patent Application No. 1802468.7.

P. Eh. Hovsepian et al., "CrAlYN/CrN superlattice coatings deposited by the combined high power impulse magnetron sputtering/unbalanced magnetron sputtering technique;" Surface and Coatings Technology 201 (2006) pp. 4105-4110.

* cited by examiner

COATED SUBSTRATE

CROSS-REFERENCE TO RELATED APPLICATIONS

This specification is based upon and claims the benefit of priority from UK Patent Application Number 1802468.7 filed on 15 Feb. 2018, the entire contents of which are incorporated herein by reference.

TECHNICAL FIELD

The present disclosure concerns a coated substrate, and in particular a coating for improving oxidation resistance of gas turbine aerofoils.

BACKGROUND

Titanium aluminide aerofoils, such as those found in gas turbine engines, operate in a high temperature environment that encourages oxidation and corrosion. This is detrimental to the integrity of the parts. To mitigate against such oxidation and corrosion, coating systems have been proposed. In these systems, coatings can be applied to the part to be protected by physical vapour deposition (PVD) methods.

However, such coatings may themselves reduce the integrity of the system due to their brittle nature, or may only provide limited ability to withstand the diffusion of corrosive species into the underlying substrate. Often coatings only have limited temperature durability before excessive oxidation of the substrate is seen. Moreover, surface cracking has been observed to occur during exposure to high temperatures.

Therefore, there remains a problem of how to provide a substrate coating that can provide an effective oxidation protection whilst also enduring the physical rigours of high temperature environments.

High power impulse magnetron sputtering (HIPIMS) is a known PVD technique—GB 2,450,950, for example, considers HIPIMS coatings for machine tools. It presents techniques incorporating HIPIMS into the provision of coatings such as those presented by Lembke et al in "Significance of Y and Cr in TiAlN hard coatings for dry high speed cutting", Surface Engineering 17(2) pages 153-158 (2001) in which the coating material Cr has been implanted in the interface using an arc discharge. It refers to HIPIMS techniques presented in the paper by P. Eh. Hovsepian, C. Reinhard and A. P. Ehiasarian entitled "CrAlYN/CrN superlattice coatings deposited by the combined high power impulse magnetron sputtering/unbalanced magnetron sputtering technique" in Surface and Coatings Technology 201 (2006) pages 4105-4110. That reference describes, amongst other things, the pretreatment of the metal substrate in the sense of a cleaning/etching treatment by bombarding the substrate with Cr ions generated by the HIPIMS technique. GB 2,450,950 goes on to use the HIPIMS technique to provide a HIPIMS superlattice structure on a substrate.

SUMMARY

The present inventors have identified that that the use of HIPIMS for coating aerofoils can be more advantageous that alternative PVD processes. HIPIMS can produce a higher density coating than alternative PVD processes. The higher density achieved minimises intercolumnar porosity in the coating, which is a pathway for corrosive species to transport through the coating from the environment and attack the substrate. Moreover, HIPIMS can be used to provide a coating architecture that consists of a plurality of layers that provide an effective barrier, through multiple interfaces to oxidation and corrosive species and which improves coating toughness. In particular, the multilayer interfaces produced by HIPIMS are very sharp and flat. This makes them particularly effective as a barrier to diffusion due to the limited atomic misfit.

The inventors have also identified particular compositions of coating that are effective. By selecting particular elements for use in the coating layers, the coating can be controlled to a) form a dense oxide scale that inhibits further oxidation and corrosion and b) to stabilise the oxide scale to prevent it spalling off and exposing unreacted coating or substrate. It is believed that cracking in prior art coatings is due to tensile stress exerted on the coating by the difference in thermal expansion coefficients of the coating and the substrate. This cracking produces fatigue deficit and reduces the effectiveness of the coating for inhibiting further oxidation and corrosion. The inventors have identified particular compositions that can at least partially mitigate these issues.

According to one aspect, the present invention provides a coated substrate comprising a metal or metal alloy such as a high speed steel, TiAl based alloy or Ni based alloy or an electrically conductive ceramic material, wherein the coating comprises a hard material protective coating comprising alternating layers of different compositions, wherein a first composition of the alternating layers comprises silicon, Si, and/or a second composition of the alternating layers comprises boron, B. Such coatings exhibit improved protection in terms of oxidation resistance and cracking. The provision of the alternating layers comprising Si and B is believed to inhibit the fast diffusion of oxygen along grain boundaries.

The first composition of the alternating layers may comprise aluminium and silicon. Additionally or alternatively, the second composition of the alternating layers may comprise aluminium and boron. For example, the first composition of the alternating layers may comprise AlSi, and/or the second composition of the alternating layers may comprise AlB.

Optionally, the layers comprising silicon are silicon containing metallic nitride layers, such as TiAlSiN, CrAlSiN, AlSiN, ZrAlSiN, TiAlSiYN, CrAlSiYN, AlSiYN, ZrAlSiYN.

Optionally, the layers comprising silicon contain 0.5 to 30 at % Si.

Optionally, the layers comprising boron are boron containing metallic nitride layers also comprising a proportion of one or more rare earth elements such as ytrrium, for example TiAlCrBYN, CrAlBYN, ZrCrAlBYN, TiAlCrBN, CrAlBN or ZrCrAlBN.

Optionally, the layers comprising boron comprise 0.1 to 20 at % B.

Optionally, a bilayer thickness of the alternating layers is in the range of 1 to 20 nm, preferably within the range of 2 to 5 nm. It is believed that this range of thicknesses exploits the superlattice effect to provide improved physical properties to the coatings.

Optionally, the coated substrate further comprises an interface layer adjacent to the substrate which is a nitrogen free intermetallic layer containing a proportion of one or more rare earth elements, optionally yttrium.

Optionally, the substrate is an aerofoil for a gas turbine engine.

According to a second aspect of the invention, there is provided a gas turbine aerofoil comprising a hard material protective HIPIMS coating. A HIPIMS coating is denser than that of alternative PVD processes, and the multilayer interfaces produced by HIPIMS are very sharp and flat. This makes HIPIMS coatings particularly effective as a barrier to diffusion due to their dense grain boundaries.

According to a third aspect of the invention, there is provided a gas turbine engine comprising a coated substrate of the first aspect, wherein the substrate is an aerofoil, or a gas turbine aerofoil according to the second aspect.

According to a fourth aspect of the invention, there is provided a method for the manufacture of a hard material protective coating on a substrate comprising a metal or metal alloy such as a high speed steel, a TiAl based alloy or an Ni based alloy or an electrically conductive ceramic material, the method comprising: depositing alternating layers of different compositions, wherein a first composition of the alternating layers comprises silicon, Si, and/or a second composition of the alternating layers comprises boron, B.

Optionally, the deposition can be performed by any one of HIPIMS coating, arc vaporization coating and magnetron sputtering.

Optionally, the alternating layers have a bilayer thickness in the range of 1 to 20 nm, preferably within the range of 2 to 5 nm.

Optionally a strength of a horizontal component of a magnetic field in front of the deposition target is preferably in the range of from 100 to 1500 Gauss, more preferably 200 to 1000 Gauss, and still more preferably 300 to 500 Gauss and most preferably around 400 Gauss.

According to a fifth aspect of the invention there is provided the use of HIPIMS to provide a gas turbine aerofoil with a hard material protective coating.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION

Figure 2:
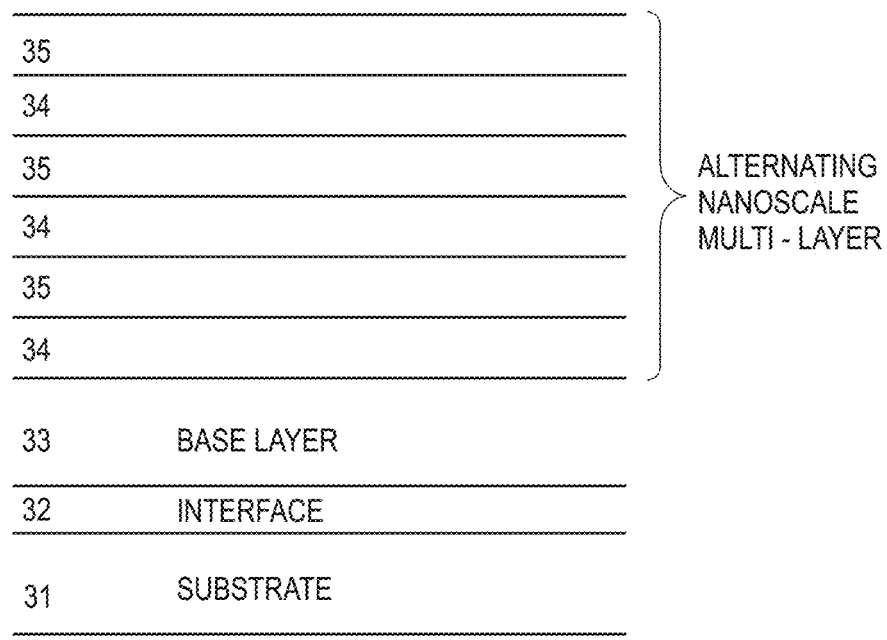
Figure 3:
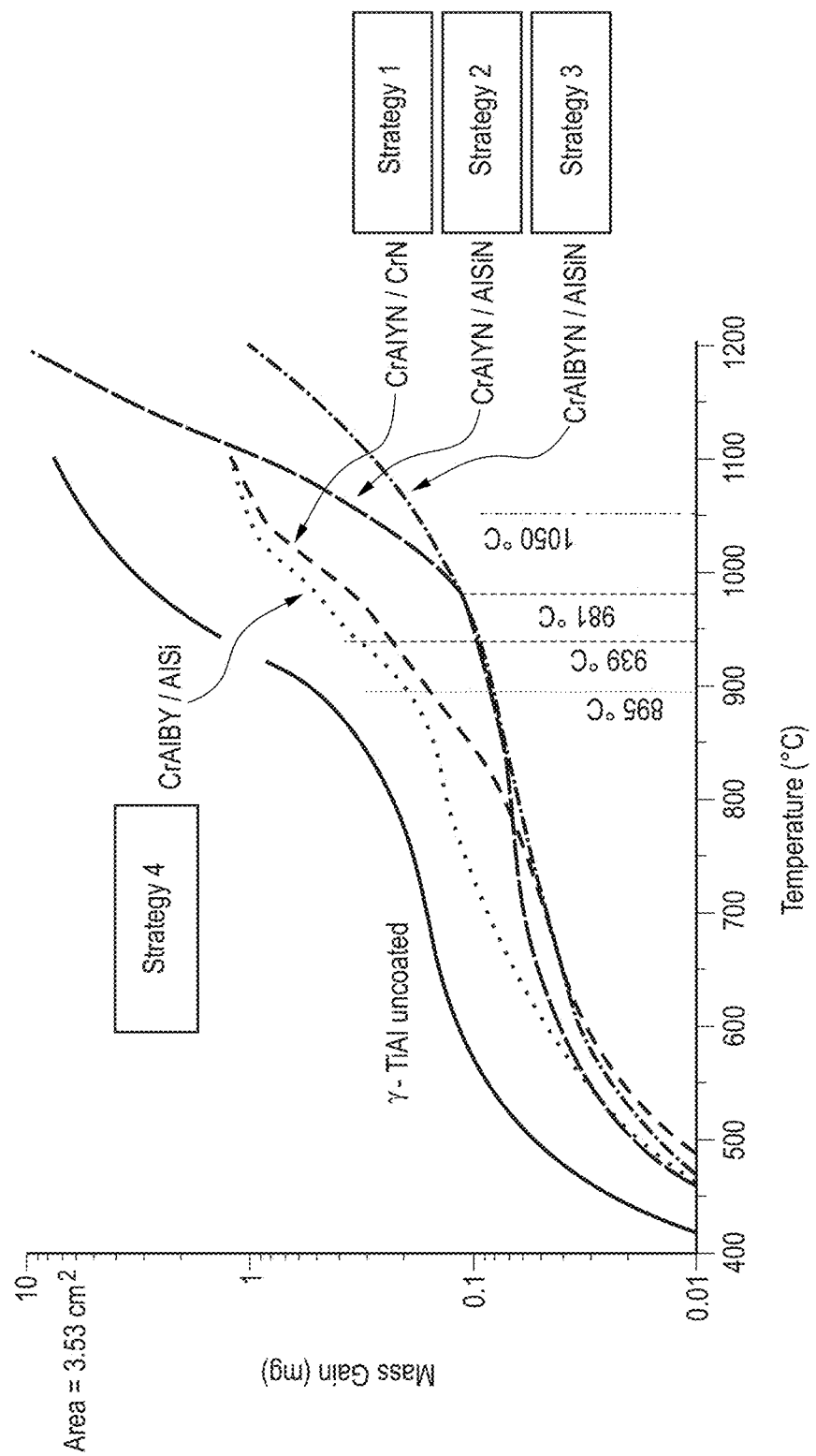
Figure 4:
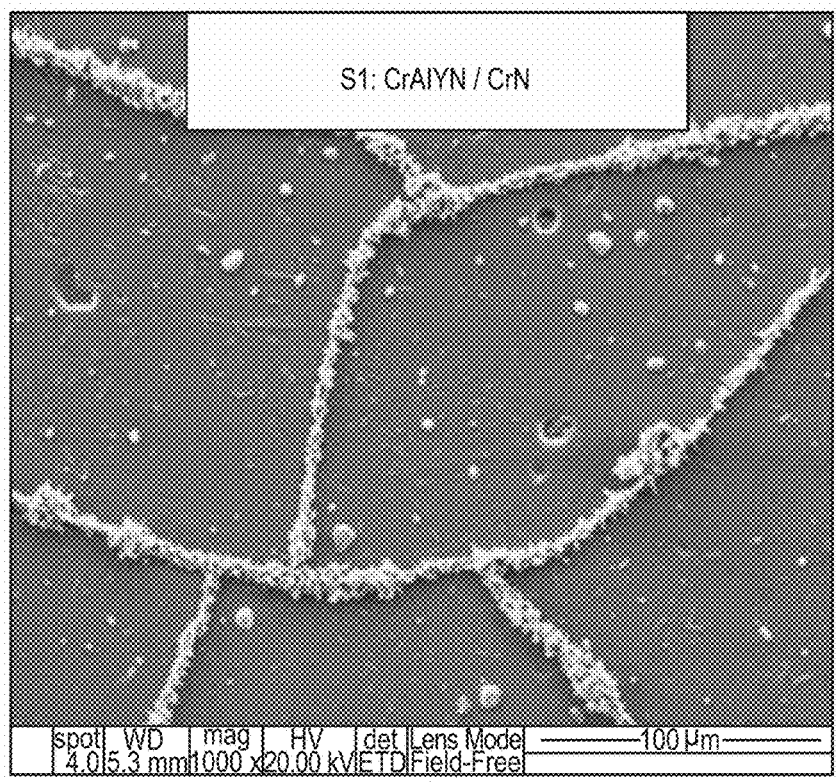
Figure 5:
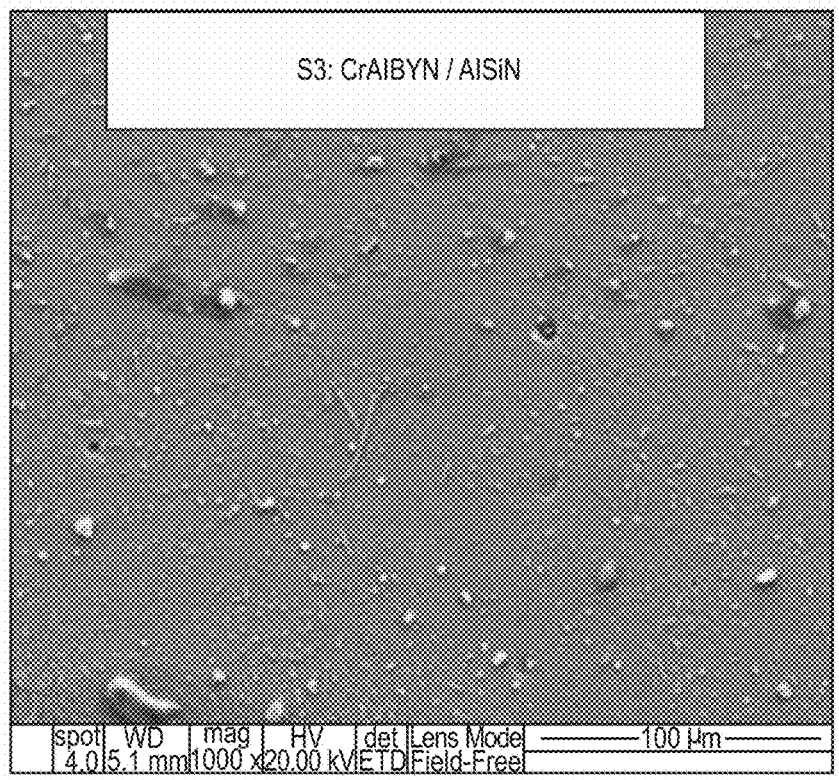

Embodiments will now be described by way of example only, with reference to the Figures, in which:

FIG. 1 is a sectional side view of a gas turbine engine;
FIG. 2 is a schematic cross-section of a layered coating on a substrate;
FIG. 3 is a graph showing the results of thermo-gravimetric tests;
FIG. 4 is a micrograph of a coating following a thermo-gravimetric test; and
FIG. 5 is a micrograph of another coating following a thermo-gravimetric test.

DETAILED DESCRIPTION

With reference to FIG. 1, a gas turbine engine is generally indicated at 10, having a principal and rotational axis 11. The engine 10 comprises, in axial flow series, an air intake 12, a propulsive fan 13, an intermediate pressure compressor 14, a high-pressure compressor 15, combustion equipment 16, a high-pressure turbine 17, an intermediate pressure turbine 18, a low-pressure turbine 19 and an exhaust nozzle 20. A nacelle 21 generally surrounds the engine 10 and defines both the intake 12 and the exhaust nozzle 20.

The gas turbine engine 10 works in the conventional manner so that air entering the intake 12 is accelerated by the fan 13 to produce two air flows: a first air flow into the intermediate pressure compressor 14 and a second air flow which passes through a bypass duct 22 to provide propulsive thrust. The intermediate pressure compressor 14 compresses the air flow directed into it before delivering that air to the high pressure compressor 15 where further compression takes place.

The compressed air exhausted from the high-pressure compressor 15 is directed into the combustion equipment 16 where it is mixed with fuel and the mixture combusted. The resultant hot combustion products then expand through, and thereby drive the high, intermediate and low-pressure turbines 17, 18, 19 before being exhausted through the nozzle 20 to provide additional propulsive thrust. The high 17, intermediate 18 and low 19 pressure turbines drive respectively the high pressure compressor 15, intermediate pressure compressor 14 and fan 13, each by suitable interconnecting shaft.

Other gas turbine engines to which the present disclosure may be applied may have alternative configurations. By way of example such engines may have an alternative number of interconnecting shafts (e.g. two) and/or an alternative number of compressors and/or turbines. Further the engine may comprise a gearbox provided in the drive train from a turbine to a compressor and/or fan.

The high 17, intermediate 18 and low 19 pressure turbines have aerofoils that typically comprise titanium aluminide or the like.

A system for coating a TiAl based alloy substrate, or other substrate such as a high speed steel, Ni based alloy or an electrically conductive ceramic material, will now be discussed with reference to FIG. 2.

The coated substrate 30 of FIG. 2 comprises substrate layer 31 with alternating coating layers 34, 35. There may also be an interface layer 32 and base layer 33. Such a structure can be produced following a modified technique based upon GB 2,450,950, which is hereby incorporated by reference. As such, only the differences with respect to the prior technique, relating to the particular element selection and process parameters found to be advantageous, are discussed in detail herein.

The alternating layers 34, 35 preferably comprise alternating layers of different compositions. Preferably the layers alternately comprise silicon, Si, and boron, B. That is, alternate ones of the layers comprise silicon but essentially no boron, whilst the other layers comprise boron but essentially no silicon. However, the coating may include alternating and different compositions in which one composition comprises silicon whilst the other composition comprises essentially no silicon, without necessarily also comprising boron. Similarly the coating may include two alternating and different compositions in which one composition comprises boron whilst the other composition comprises essentially no boron, without necessarily also comprising silicon.

The alternating layers may be: Si or B containing metallic layers, such as AlSi; or Si or B containing metallic layers that also comprise a proportion of one or more rare earth elements such as yttrium, such as CrAlBY; or Si or B containing metallic nitride layers, such as TiAlSiN, CrAlSiN, ZrAlSiN, AlSiN, TiAlBN, CrAlBN, ZrAlBN or AlBN; or Si or B containing metallic nitride layers that also comprise a proportion of one or more rare earth elements such as yttrium, for example TiAlCrBYN, CrAlBYN, TiAlCrSiYN, CrAlSiYN. Other rare earth metals could also be substituted for yttrium, for example Sc, La or Ce. Where one set of alternating layers does not comprise Si or B, they may comprise a metallic nitride such as CrN, CrAlN or CrAlYN.

Silicon may be present in a composition of the alternating layers in the range of 0.5-30 at. %, optionally 5-25 at. %, further optionally 10-15 at. %, and preferably about 12 at. %. Boron may be present in a composition of the alternating layers in the range of 0.1-10 at. %, optionally 2-8 at. %, further optionally 4-6 at. %, and preferably about 5 at. %. Yttrium may be present in a composition of the alternating layers in the range of 0.1-10 at. %, optionally 0.5-6 at. %, further optionally 1-3 at. %, and preferably about 2 at. %. Chromium may be present in one or more compositions of the alternating layers in the range of 20-80 at. %; and aluminium may be present in one or more compositions of the alternating layers in the range of 20-80 at. %.

The alternating layers 34, 35 may be produced by any physical vapour deposition (PVD) method, such as HIPIMS coating, arc vaporization coating and direct current magnetron sputtering (DCMS). However, HIPIMS coating, or a combination of a HIPIMS source with, e.g. three, DCMS sources, is preferred as this can provide sharp and flat interfaces between the alternating layers, and this is believed to contribute to their effectiveness as a barrier coating. HIPIMS can provide distinct layers at the nanoscale, preferably with a bilayer thickness (i.e. the thickness of two adjacent layers of different composition) of 1 to 20 nm, and more preferably within the range of 2 to 5 nm.

During the deposition, the strength of the horizontal component of the magnetic field in front of the deposition target is preferably in the range of from 100 to 1500 Gauss, more preferably 200 to 1000 Gauss, and still more preferably 300 to 500 Gauss and most preferably around 400 Gauss.

During the deposition, the power density of the HIPIMS pulse discharge is preferably more than 50 W/cm$^2$, more preferably more than 200 W/cm$^2$ and still more preferably 300 W/cm$^2$ or more.

During the deposition, the HIPIMS pulse duration is preferably in the range of from 10 to 10,000 µs, more preferably from 40 to 1,000 µs, still more preferably from 60 to 100 µs, and most preferably around 80 µs.

During the deposition, the HIPIMS pulse interval is preferably in the range of from 0.2 milliseconds to 1000 s, more preferably from 1 ms to 1 s, still more preferably from 1.5 to 500 ms, and even more preferably around 2.5 ms.

The interface layer 32 and base layer 33 serve to bind the alternating layers 34, 35 to the substrate 31. In particular, the interface layer 32 adjacent to the substrate 31 can be a nitrogen free intermetallic layer containing a proportion of one or more rare earth elements. Yttrium, in particular, may be used in the interface layer, preferably in the range of 0.1-10 at. %. The interface layer may further optionally contain other elements, such as boron.

The base layer 33 may have the same composition as one of the alternating layers, but have a greater thickness to assist with adhering the alternating layers to the underlying substrate 31 and/or interface 33. For example the base layer may be the same composition as the boron containing alternating layers.

Examples

FIG. 3 is a graph showing the results of thermo-gravimetric tests using a Setaram Setsys instrument operating in dry Air and a temperature ramp rate of 1 K min$^{-1}$ to ensure equilibrium conditions. The samples were ground gamma-TiAl disks with diameter of 15 mm and thickness of 1 mm suspended through a 1 mm diameter hole near the edge of the sample. Thermogravimetric tests were performed on four different samples provided with different coatings, along with a result for an uncoated γ-TiAl substrate.

The samples were produced following the methodology of GB 2,450,950, with the following differences in operating conditions during the deposition of the alternating layer structures of the coatings of 'strategy 2', 'strategy 3' and 'strategy 4':
  one HIPIMS source was used and three conventional direct current magnetron sputtering (DCMS) sources;
  the strength of the horizontal component of the magnetic field in front of the target was around 400 Gauss;
  the power density of the HIPIMS pulse discharge was around 300 W/cm$^2$;
  the HIPIMS pulse duration was around 80 µs;
  the HIPIMS pulse interval was 2.5 milliseconds
  the temperature of deposition was around 400° C. throughout the process.

The different samples were provided with different coatings. The coating of 'strategy 1' comprised alternating layers of CrAlYN and CrN with a bilayer thickness of 2.7 nm, with a composition of Cr 19 at. %, Al 29 at. %, Y 2 at. %, and N 50 at. %. The coating of 'strategy 2' comprised alternating layers of CrAlYN and AlSiN with a bilayer thickness of 2.9 nm, with a composition of Cr 14 at. %, Al 22 at. %, Y 2 at. %, Si 12 at. %, and N 50 at. %. The coating of 'strategy 3' comprised alternating layers of CrAlBYN and AlSiN with a bilayer thickness of 2.6 nm, with a composition of Cr 12 at. %, Al 19 at. %, Y 2 at. %, Si 12 at. %, B 5 at. %, and N 50 at. %. The coating of 'strategy 4' comprised alternating layers of CrAlBY and AlSi with a bilayer thickness of 5.2 nm with a composition of Cr 24 at. %, Al 38 at. %, Y 4 at. %, Si 24 at. %, and B 10 at. %.

FIG. 3 illustrates that all the coatings give an improvement (i.e. reduction in mass gain) compared to the uncoated sample. Moreover, all the strategies comprising metallic nitride alternating layers performed better than strategy 4, which did not. Nonetheless, strategy 4, comprising B and Si in the alternating layers, still provides an improvement compared to the uncoated sample.

Also, a surprising difference can be observed between the improvements achieved with the coatings of strategies 2 and 3 compared with strategy 1. These strategies all involve alternating nitride layers, but strategy 1 involves no B or Si in the alternating layers. The improvements at high temperature are particularly marked, which provides benefits for components such as gas turbine aerofoils which operate at high temperatures.

FIG. 4 is a micrograph of the surface of the strategy 1 sample after the thermo-gravimetric test. FIG. 5 is a micrograph of the surface of the strategy 3 sample after the thermo-gravimetric test. As can be seen from these two figures, the strategy 1 sample shows undesirable cracks and substrate oxides in the coating. In contrast, the strategy 3 sample shows no cracking or substrate oxides confirming that it remains as a good diffusion barrier, as expected from the thermo-gravimetric test. It is expected that similar results would be observed for other substrate metals or metal alloys such as a high speed steel, other TiAl based alloys or Ni based alloys.

Without wishing to be bound by theory, it is believed that the process conditions used to create distinct layers at the nanoscale, with a bilayer thickness of 1 to 20 nm, and more preferably within the range of 2 to 5 nm, provide improved physical properties by exploiting the superlattice effect. The bilayer thickness allows for shearing to generate dislocations within the layers, but the dislocations are prevented from crossing the layer boundaries, and thus prevented from moving. This leads to increased hardness. At greater thicknesses the interaction between layers is reduced, and dislocations can propagate through the layers, reducing hardness. At smaller thicknesses, dislocations are prevented from forming at all.

Still without wishing to be bound by theory, it is believed that the different elements of the coatings provided different advantages that, when combined, contribute to the observed performance of the coatings. Cr, Al, and Si are known to form dense oxide scales which provide better protection against oxygen inward diffusion. Dense oxides react slower with the aggressive molten salts such as $Na_2SO_4$, NaCl as well as $V_2O_5$ and $SO_2$ produced by burning aviation fuel. Therefore it is believed that the inclusion of these elements helps achieve longer protection against hot corrosion attack. Yttrium has a high affinity for oxygen, and thus produces stable oxide at high temperatures. It is believed that its inclusion improves oxide scale adhesion to the substrate and reduces oxide scale spallation. Also, by including Yttrium, with its larger atom, in the interface between the substrate and the layered coating, it is thought that a tolerable level of compressive stress is produced in the interface which can hinder fatigue crack formation. Boron in small amounts in bulk Ti-based alloys can improve their ductility, and so it is believed the inclusion of Boron can help reduce cracking in the coatings due to mismatch in thermal expansion coefficients, as well as to reduce crack formation probability in the coated substrate under cyclic (fatigue) load conditions. Borides also show high resistance against hot corrosion. Moreover, all of Cr, Al, Si, Y and B are relatively light elements with small atomic radius, which means that they have high ad-atom mobility in conditions of ion assisted deposition on a condensation surface. This is believed to improve coating density. It is also believed that is advantageous to have elements such as B and Si at grain boundaries to inhibit the fast diffusion of oxygen along these pathways. By the sequential delivery of these elements from alternating sputtering targets, multiple sharp barriers to diffusion and dislocation movement can be provided.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A coated substrate comprising:
   a metal or metal alloy substrate;
   a coating layer coated on the substrate and comprising alternating layers of different compositions, where at least one of (i) a first composition of the alternating layers comprises silicon, Si, and (ii) a second composition of the alternating layers comprises boron, B; and
   an interface layer adjacent to the substrate which is a nitrogen free intermetallic layer containing a proportion of yttrium.

2. The coated substrate according to claim 1, wherein the layers comprising silicon are silicon containing metallic nitride layers.

3. The coated substrate according to claim 1, wherein the layers comprising silicon contain 0.5 to 30 at % Si.

4. The coated substrate according to claim 1, wherein the layers comprising boron are boron containing metallic nitride layers also comprising a proportion of one or more rare earth elements.

5. The coated substrate according to claim 1, wherein the layers comprising boron comprise 0.1 to 20 at % B.

6. The coated substrate according to claim 1, wherein at least one of (i) the first composition of the alternating layers comprises aluminium and silicon and (ii) the second composition of the alternating layers comprises aluminium and boron.

7. The coated substrate according to claim 1, wherein a bilayer thickness of the alternating layers is in the range of 1 to 20 nm.

8. The coated substrate according to claim 1, wherein the coating layer is a hard protective coating.

9. The coated substrate according to claim 1, wherein the metal or metal alloy is a high speed steel, TiAl based alloy or Ni based alloy, or an electrically conductive ceramic material.

10. The coated substrate according to claim 1, wherein the silicon containing metallic nitride layers comprise at least one of TiAlSiN, CrAlSiN, or AlSiN.

11. The coated substrate according to claim 1, wherein the boron containing metallic nitride layers comprise at least one of TiAlCrBYN or CrAlBYN.

12. The coated substrate according to claim 1, wherein the substrate is an aerofoil for a gas turbine engine.

13. A gas turbine engine comprising a coated substrate according to claim 1.

14. A method for manufacturing the coated substrate of claim 1, the method comprising:
    depositing the alternating layers on the substrate.

15. The method according to claim 14, wherein the deposition is performed by any one of HIPIMS coating, arc vaporization coating and magnetron sputtering.

16. The method according to claim 14, wherein the alternating layers have a bilayer thickness in the range of 1 to 20 nm.

17. The method according to claim 14, wherein during deposition of the alternating layers, a strength of a horizontal component of a magnetic field in front of the deposition target is in the range of from 100 to 1500 Gauss.

18. The method according to claim 14, wherein at least one of (i) the first composition of the alternating layers comprises aluminium and silicon and (ii) the second composition of the alternating layers comprises aluminium and boron.

* * * * *